United States Patent [19]

D'Amico et al.

[11] 4,168,399

[45] Sep. 18, 1979

[54] PAGING ENCODER SYSTEM UTILIZING A TELEPHONE LINE LINK

[75] Inventors: Thomas V. D'Amico, Lauderhill; Mark H. Rackin; Victor Jensen, both of Sunrise; Norman E. Schultz, North Lauderdale; John J. Cady, Sunrise; William J. Macko, Lauderdale Lakes; Carl R. Steinbach; Nicholas Petrakos, both of Plantation, all of Fla.

[73] Assignee: Motorola, Inc., Schaumburg, Ill.

[21] Appl. No.: 903,365

[22] Filed: May 5, 1978

Related U.S. Application Data

[62] Division of Ser. No. 776,023, Mar. 9, 1977, Pat. No. 4,103,107.

[51] Int. Cl.$^{2}$ .......................... H03G 1/00; H04Q 7/04

[52] U.S. Cl. ............................... 179/1 VL; 179/2 EC

[58] Field of Search ................ 179/1 VL, 2 EC, 2 A; 325/400; 330/278, 284; 333/17 L

[56] References Cited

U.S. PATENT DOCUMENTS 3,470,480 9/1969 Smart et al. .......................... 325/400

*Primary Examiner*—Kathleen H. Claffy
*Assistant Examiner*—Kenneth A. Chayt
*Attorney, Agent, or Firm*—Margaret Marsh Parker; James W. Gillman

[57] ABSTRACT

A base station encoder is connected to a decoder terminal and paging transmitter by means of a single voice-pair telephone line link. Automatic operations reduce operator fatigue and operating costs. Digital, tone-keyed gain controls automatically compensate for line losses. All dialing, including long distance and overseas calls, and station identification are done automatically.

6 Claims, 7 Drawing Figures

PAGING ENCODER SYSTEM UTILIZING A TELEPHONE LINE LINK

This is a division of application Ser. No. 776,023, filed Mar. 9, 1977, now U.S. Pat. No. 4,103,107.

BACKGROUND OF THE INVENTION

This invention relates to the field of radio paging and more particularly to a system for encoding a page address into tone signals for transmission over telephone lines to a decoder and transmitter.

Prior art paging systems have encoded page addresses into DTMF (dual tone, multi-frequency) signals to be sent over telephone company lines, but these systems have required many unnecessary steps on the part of the operator, causing fatigue from listening to a variety of signals and responding properly to them. Errors are also possible under such circumstances, and time has to be allowed for operator reaction. Other systems have required a separate DC pair of telephone lines when using a dedicated line in order for the decoder terminal to sense an incoming call. This is an extra expense for the user as well as a disadvantage to the telephone company, since DC signaling is not possible over paths such as microwave lengths and certain switching points. Prior systems have had station identification transmitted automatically at regularly timed intervals, whereas an ID after each transmission is preferred by the FCC. Use of a telephone company-supplied tone encoder (a type of telephone) for providing DTMF signals has numerous disadvantages besides cost, e.g., a handset must be taken off-hook, held to monitor incoming signals and send voice messages, then placed on-hook after each transmission. The handset microphone, being "live" while off-hook can pick up noise which would interfere with transmission of DTMF, so that operator discipline is required. Other systems have required the use of an encoder for testing the decoder since the input of the decoder did not appear as a telephone to the telephone lines. Another problem in previous systems has been the varying line loss in various telephone paths.

SUMMARY OF THE INVENTION

It is therefore an object of this invention to provide a paging system using a single voice-pair of telephone lines to couple a base station to a transmitter.

It is a further object to reduce operator fatigue and errors, as well as line and coupler charges.

It is another object to minimize the number of functions which must be performed by the operator.

It is a particular object to provide automatic compensation for constant line losses.

These and other objects, as will be see are provided in a paging encoder in accordance with the present invention. The page address signals at the output of the encoder console are standard dual tone, multi-frequency signals of the type now being used for telephone calling. No telephone is required as an interconnect and output device. The operator at the encoder console may choose either a switched network line or a dedicated line to a particular transmitter site. The operator merely chooses the transmitter and determines that the line and the transmitter are not busy. The terminal sends a "go-ahead" signal back to the console, and the console utilizes the level of this signal to preset a digital gain control circuit to compensate for the losses present in the telephone transmission path. The security sequence is then initiated.

The security sequence is completely automatic and the security tone also functions to disable the telephone company echo suppressors during the "receive audio" period, the tone being filtered out at the terminal end. The security tone is thus not present in the audio received back at the operator's console, which could be annoying and fatiguing to the operator's ear. With a minimum of operations and effort, a desired page code is transmitted to a terminal at the desired site, where it is decoded and coupled to the transmitter. The operator may also send a voice message following each page address if desired.

DETAILED DESCRIPTION OF A PREFERRED EMBODIMENT

Figure 1:
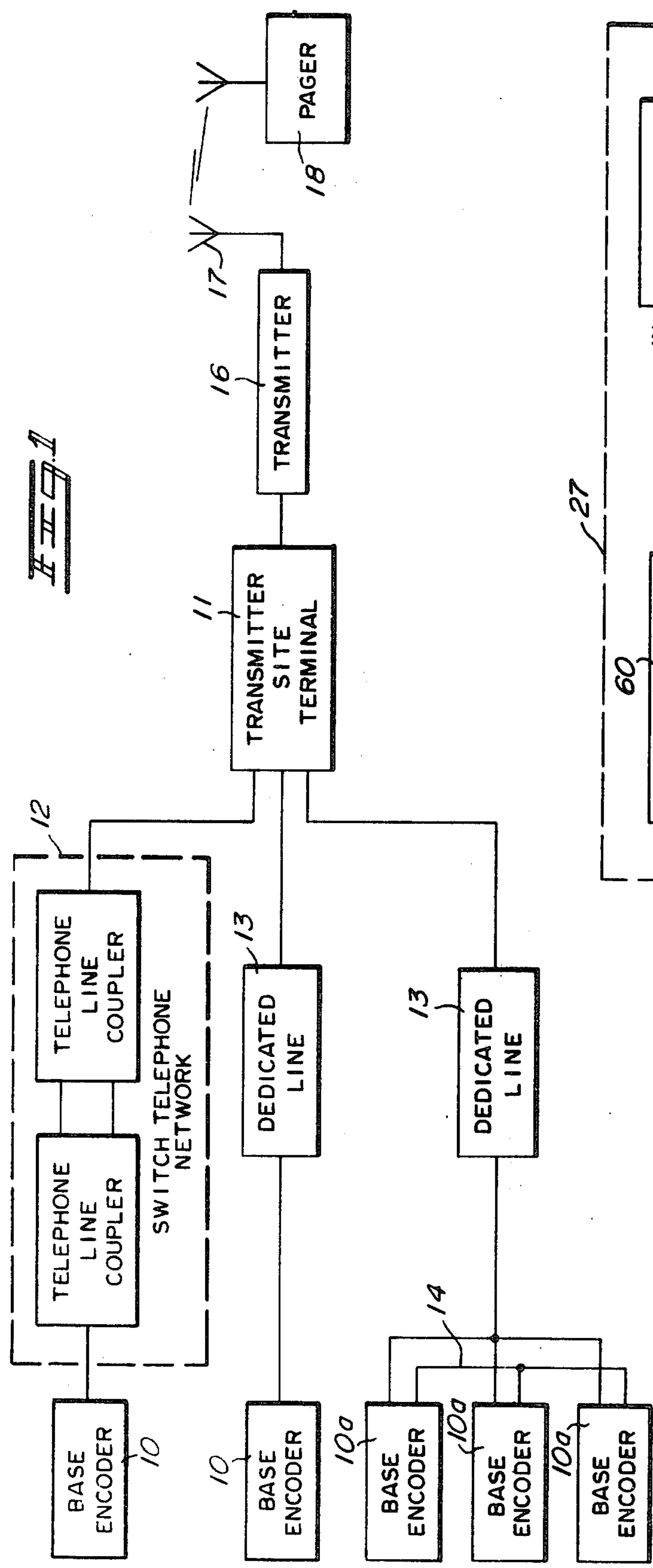
FIG. 1 is a block diagram of a complete system utilizing the invention.

FIG. 1 shows a system utilizing telephone lines for transmission of coded paging signals and including in an exemplary fashion some possible options. A base station encoder 10 may be connected to a transmitter site terminal 11 via a telephone company switched network 12 which could include one or more exchanges or companies, depending on the locations of the base station 10 and the transmitter 11. The encoder 10 could be connected to the terminal 11 via a dedicated line 13. Several encoders 10A at a single location can also be coupled to the terminal 11. The encoders 10A would only differ from the encoders 10 in that the encoders 10A would be linked together by a DC interlock loop 14 and each would include a lockout circuit 15 (FIG. 2) to prevent inadvertent interference from another encoder 10A. Both the switched network 12 and the dedicated line 13 are a single voice-pair, with no DC lines required. In the preferred embodiment, one console could be connected to a switched network and several dedicated lines, the selection being at the operator's discretion. Typically, the operator would choose the switched network 12 since the costs are lower, especially for long distance or overseas calls. However, for an often-used terminal at no great distance, the dedicated line 13 to that terminal might be chosen. The terminal 11 is designed to have the same input as a telephone, so that, subject only to imposed regulations, it is capable of being connected directly to the telephone company line as are telephones. This feature is particularly important in that it allows testing of the terminal by plugging a standard telephone into a test receptacle, rather than requiring an encoder at the site. The terminal 11 is located physically very close to a transmitter 16 which transmits from an antenna 17 to pagers 18 (one shown).

Figure 2:
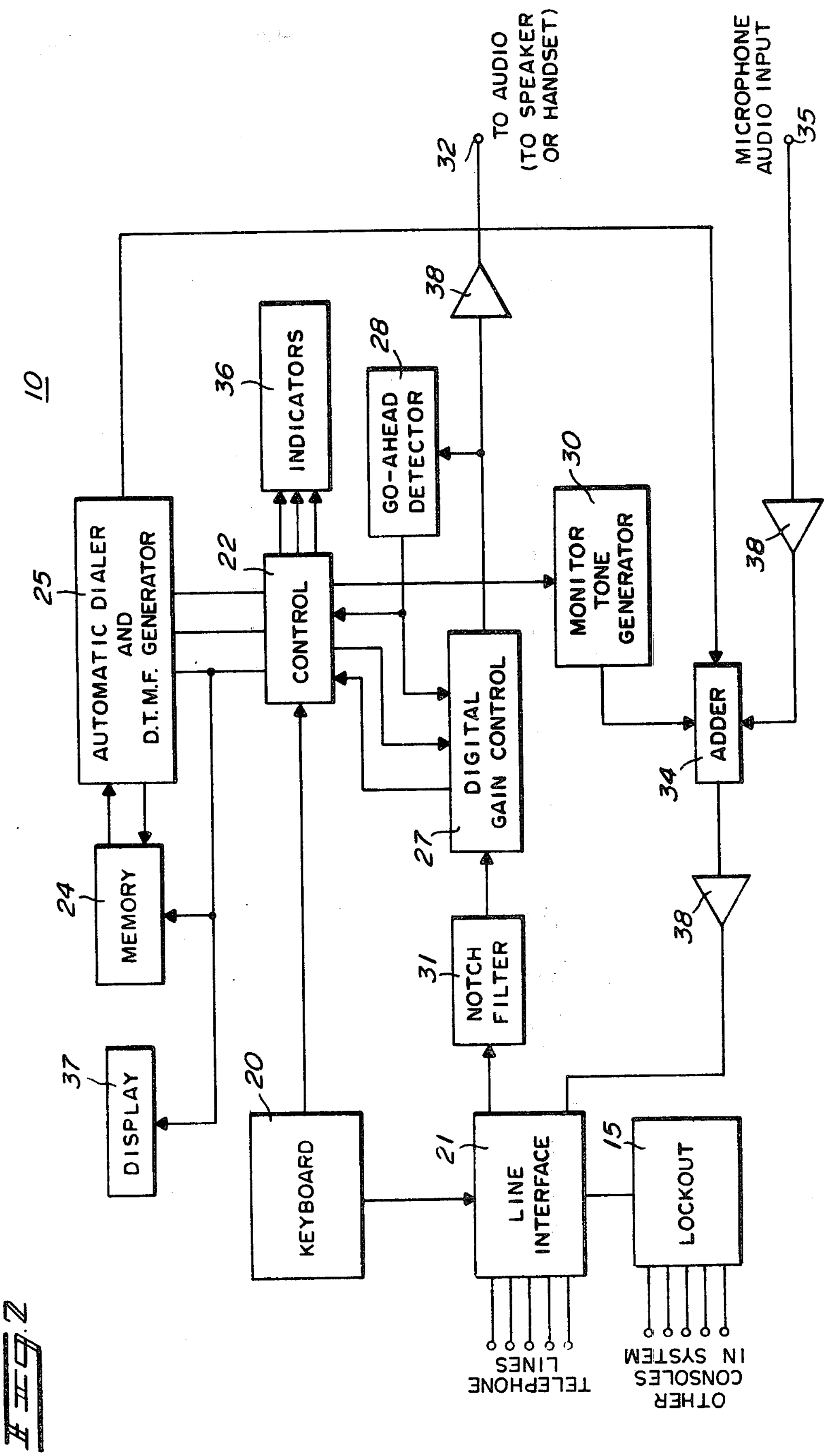
FIG. 2 is a block diagram of the encoder console of the system of FIG. 1.

In FIG. 2, a block diagram of the encoder 10 shows a keyboard 20 whereby the operator inserts data and commands. This function will be explained in detail with regard to FIG. 6. The keyboad 20 is coupled to an interface 21 for selection of a line as discussed hereinabove. The keyboard 20 is also coupled through control circuitry 22 to a memory 24 which is in turn coupled to an automatic dialer and DTMF generator 25. As will be explained hereinafter, a one or two digit code indicating a particular transmitter is inserted at the keyboard 20 by the operator and stored in the memory, as is the page address code, for subsequent transmission. At the appropriate command, the control circuitry 22 retrieves the transmitter code and activates the logic circuitry of the automatic dialer 25 to dial the telephone number of the specified transmitter. At another command, the control circuit 22 retrieves the page address code from the memory 24 and activates the automatic dialer 25 to translate the pager code into the appropriate DTMF signals. Since all telephone paths are designed for the transmission of these signals, it is desirable to encode into these standard signals for transmission on the telephone lines 12 or 13. It is to be noted that the memory 24 and the automatic dialer 25 are not used when a dedicated line is selected by the operator. As is well known, each DTMF signal is made up of two out of eight possible signals, one chosen from a group of four ranging from between 500 and 1,000 Hz, the second from a group of four ranging between 1,000 and 2,000 Hz. At the terminal 11, the DTMF signals are decoded back into the page address code which is coupled to the transmitter 16 for broadcast in a fashion well known in the art. When the terminal 11 has answered the call, a brief "go-ahead" tone is transmitted back down the telephone lines. This tone is utilized at the encoder 10 in a digital gain control circuit 27 for line loss compensation. Line losses can vary over a wide range, depending on the particular path of each individual call. The digital gain control circuit 27 will be described in detail with respect to FIGS. 4 and 5.

The "go-ahead" tone is also utilized as a control signal after being detected by a "go-ahead" tone detector 28 which is coupled to the control circuit 22. At this detect, the control circuit 22 automatically activates a monitor tone generator 30 to produce a tone, preferably around 2,100 Hz, which is transmitted over the telephone lines 12 or 13. The terminal 11 is designed to "listen" during a brief window (on the order of three seconds) for reception of this tone and, lacking detection, to disconnect. Such tones are desirable for security purposes to prevent unauthorized access to the transmitter and are more secure than a DTMF signal sent for the same purpose. A long window will, of course, allow greater opportunity for counterfeiting the tone, but if the operator must react to the "go-ahead" signal and manually activate the security tone, reaction time must be included as a part of the window. A notch filter 31 is inserted between the interface 21 and the speaker input terminal 32 to remove the monitor tone which would be annoying to the operator during the period when monitoring of the transmitted audio signals is necessary. A summing circuit 34 may be coupled to receive signals from the automatic dialer and DTMF generator 25, the monitor tone generator 30 and a microphone output terminal 35. The microphone and speaker (not shown) may be any models having suitable electrical characteristics. A preferred microphone is one designed to rest on a desk or console and having a paddle type switch actuator for the "talk" function; thus leaving the operator's hands free except during message transmission. The indicators 36 may include a variety of indicators such as "on" or "talk" lights and possibly an audio signal supplied to the speaker for a "talk" indication.

A display 37 may be coupled to the control circuitry 22 for displaying data as it is inserted at the keyboard 20, providing an accuracy check for the operator. Amplifiers 38 may be used as needed in the signal paths.

Figure 3:
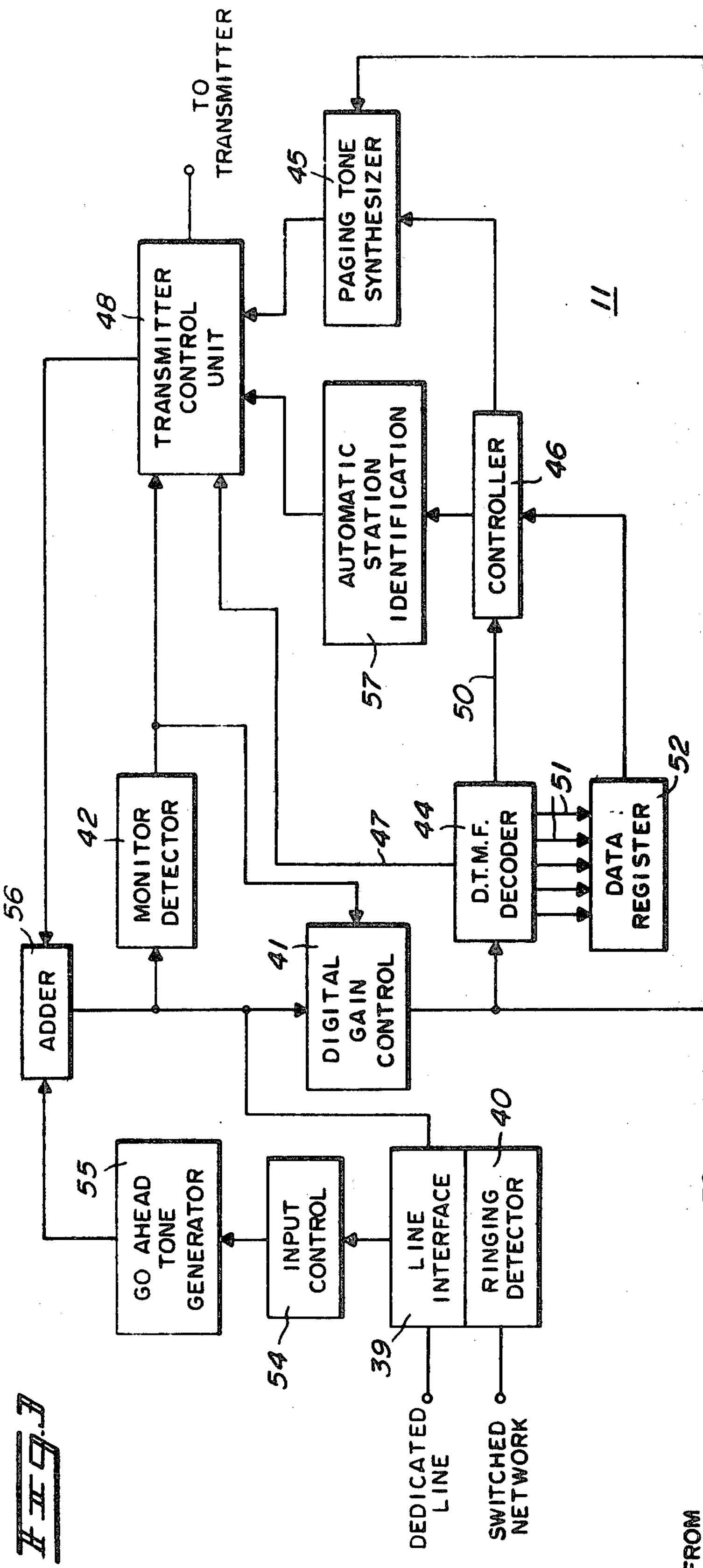
FIG. 3 is a block diagram of the decoder terminal of the system of FIG. 1.

FIG. 3 shows the terminal 11 having an interface 39 connected to the dedicated line 13 and, through a ringing detector 40, to the switched network 12. This interface appears to the telephone line as would a telephone and could, if allowed, be coupled in the same manner. A standard phone jack (not shown, is included in the interface so that testing of the terminal can be done by means of a telephone connected to a standard telephone plug. The interface 39 is coupled to a digital gain control 41 which functions in the same manner as the encoder gain control 27. The interface 39 output is also coupled to a monitor tone detector 42. The detector 42 output is coupled to the digital tone control 41 for setting the proper level of the received signal which is then coupled to a DTMF decoder 44 and a paging tone synthesizer 45. The decoder 44 has a page preamble output connection 47 coupled to a transmitter control unit (TCU) 48 which is coupled to alert the transmitter 16. The paging tone synthesizer 45 couples both paging tones and voice signals to the TCU 48. Another DTMF decoder output 50 couples a "disconnect" signal to the controller circuit 46. A third DTMF decoder output 51 (multiple connections) couples the decoder data to a data register 52 from which the data is coupled through the controller circuit 46 to the paging tone synthesizer 45.

An input control circuit 54 is coupled to the interface 40 and to a "go-ahead" tone generator 55 for initiating the tone which is, by way of an adder 56, sent back over the lines 12 or 13 to actuate the monitor tone generator 30 of the encoder 10. The TCU 48 also couples the audio being transmitted by the transmitter 16 back to the adder 56 as long as the monitor tone from the encoder 10 is being received by the decoder terminal 11. Coupled to another output of the controller circuit 46 is an automatic station identifier 57. When the DTMF decoder 44 signals the controller 46 to disconnect the transmitter 16, the controller 46 first activates the identifier 57 to send a recorded station identifying signal to the transmitter 16 for broadcast, then the transmitter 16 is shut down.

Figure 4:
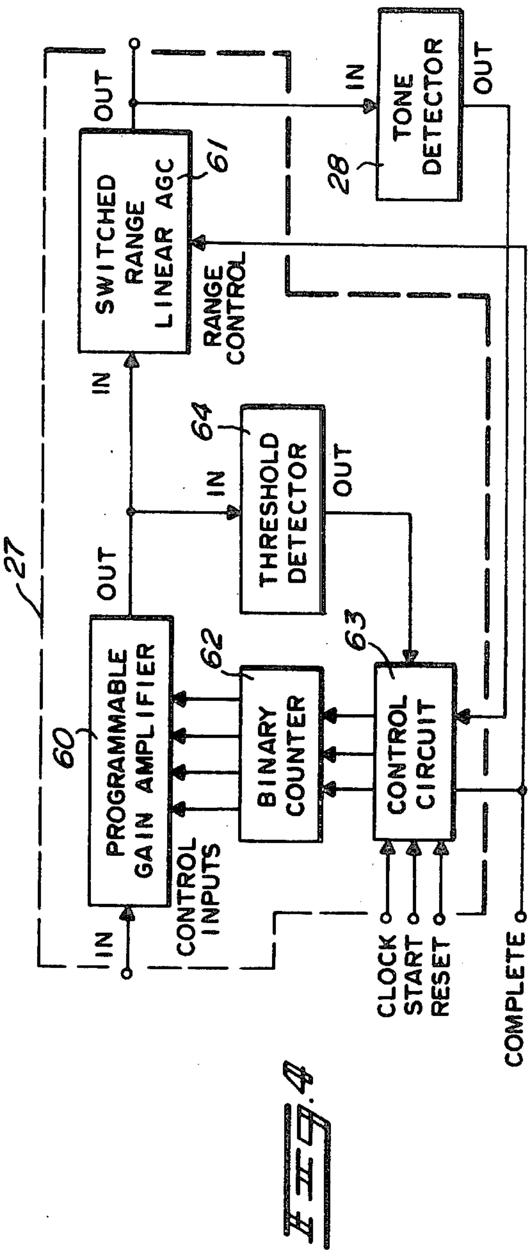
FIG. 4 is a block diagram of the digital gain control circuit of FIG. 2.
Figure 5:
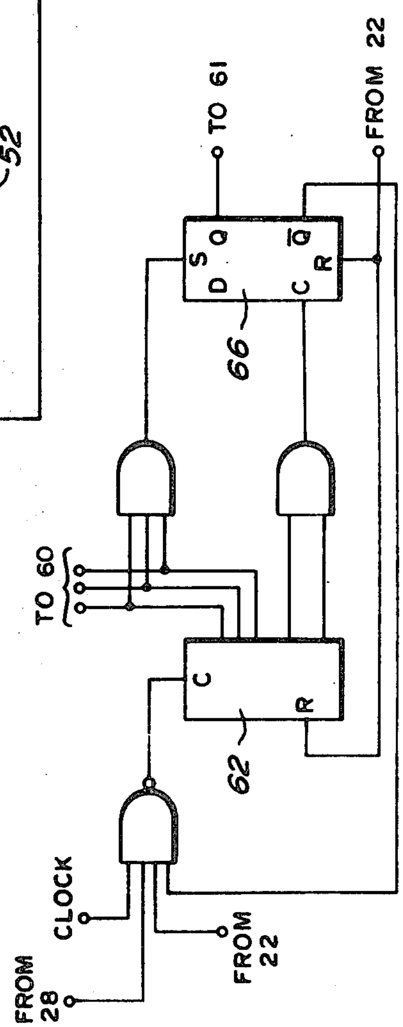
FIG. 5 is a logic diagram of a portion of FIG. 4.

FIG. 4 is a block diagram of the tone-keyed digital gain control circuit 27 of FIG. 2 which is essentially the same as the control circuit 41 of FIG. 3. The encoder gain control 27 utilizes the "go-ahead" tone level and the decoder gain control 41 utilizes the received monitor tone level. The digital control 27 includes a programmable gain amplifier 60 which is coupled to the interface 21. The amplifier 60 output is coupled to a switched range linear AGC 61. The gain of the amplifier 60 is controlled by the numerical value of the output of the binary (or other mode) digital counter 62. The gain may be related to the count linearly or logarithmically as required in a particular application. The "go-ahead" tone detector 28 is coupled between the output of the linear AGC 61 and an input of the control circuit 63 of the digital gain control 27. A threshold detector 64 is coupled between the output of the programmable gain amplifier 60 and an input of the control circuit 63. Before any signal is received, the counter 62 is reset, the gain of the programmable amplifier 60 is at its minimum, and the linear AGC 61 is set for wide dynamic range. A "start" command is received at the beginning of signal and when the "go-ahead" tone is detected, the counter 62 begins to count up, which increases the gain in the amplifier 60. When the desired amplifier output level is reached, the threshold detector 64 output goes high (or when the counter 60 reaches its maximum count) the counter stops counting up and maintains its count, and the linear AGC 61 switches to a narrow-range mode. The digital gain control 27 then remains unchanged until the input signal ends and the control circuit 63 resets the counter 62. FIG. 5 is a logic diagram showing the control logic for the counter 62.

Figure 6A:
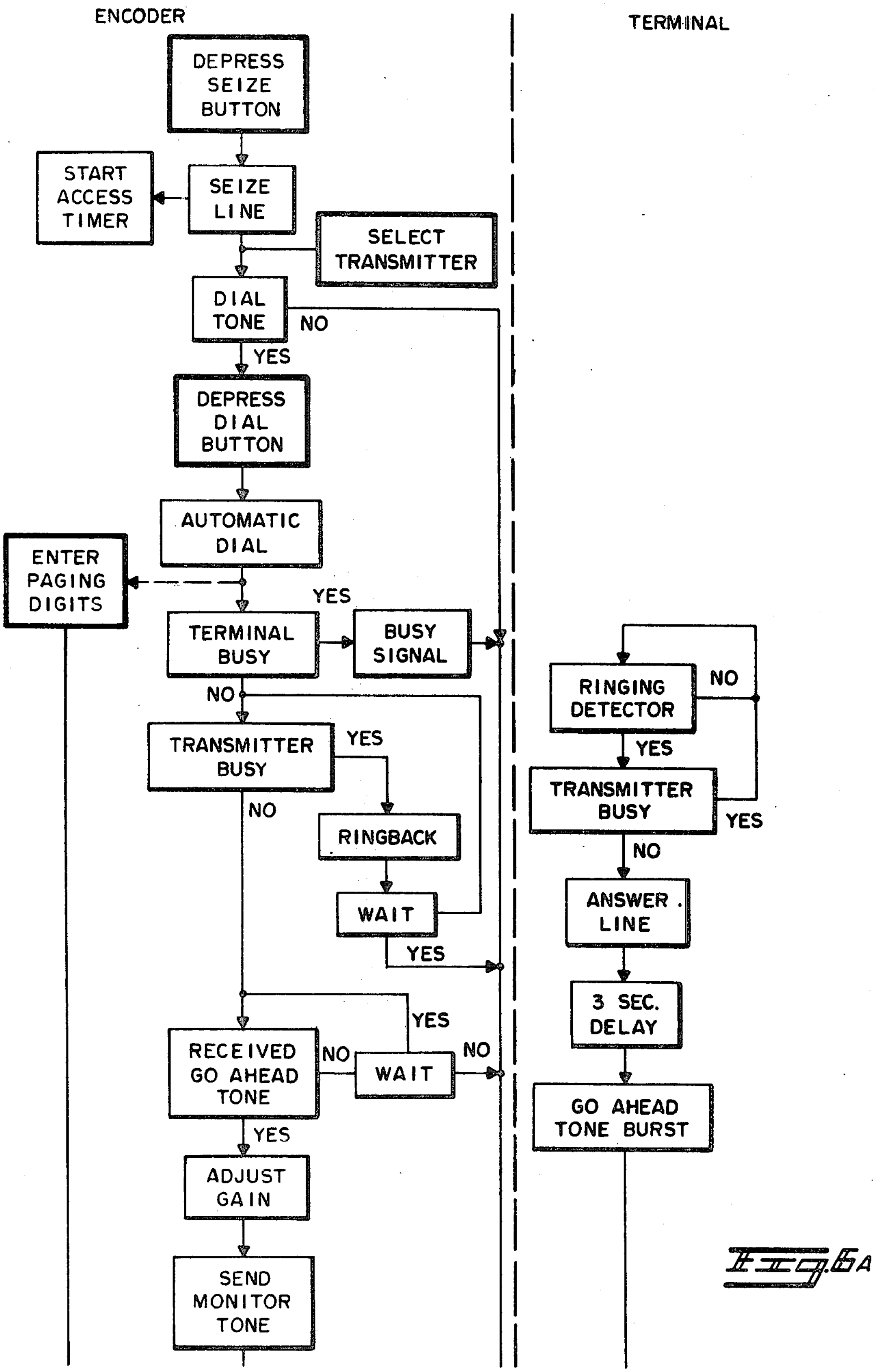
FIGS. 6A and 6B are a flow chart of the operation of the system of FIG. 1.
Figure 6B:
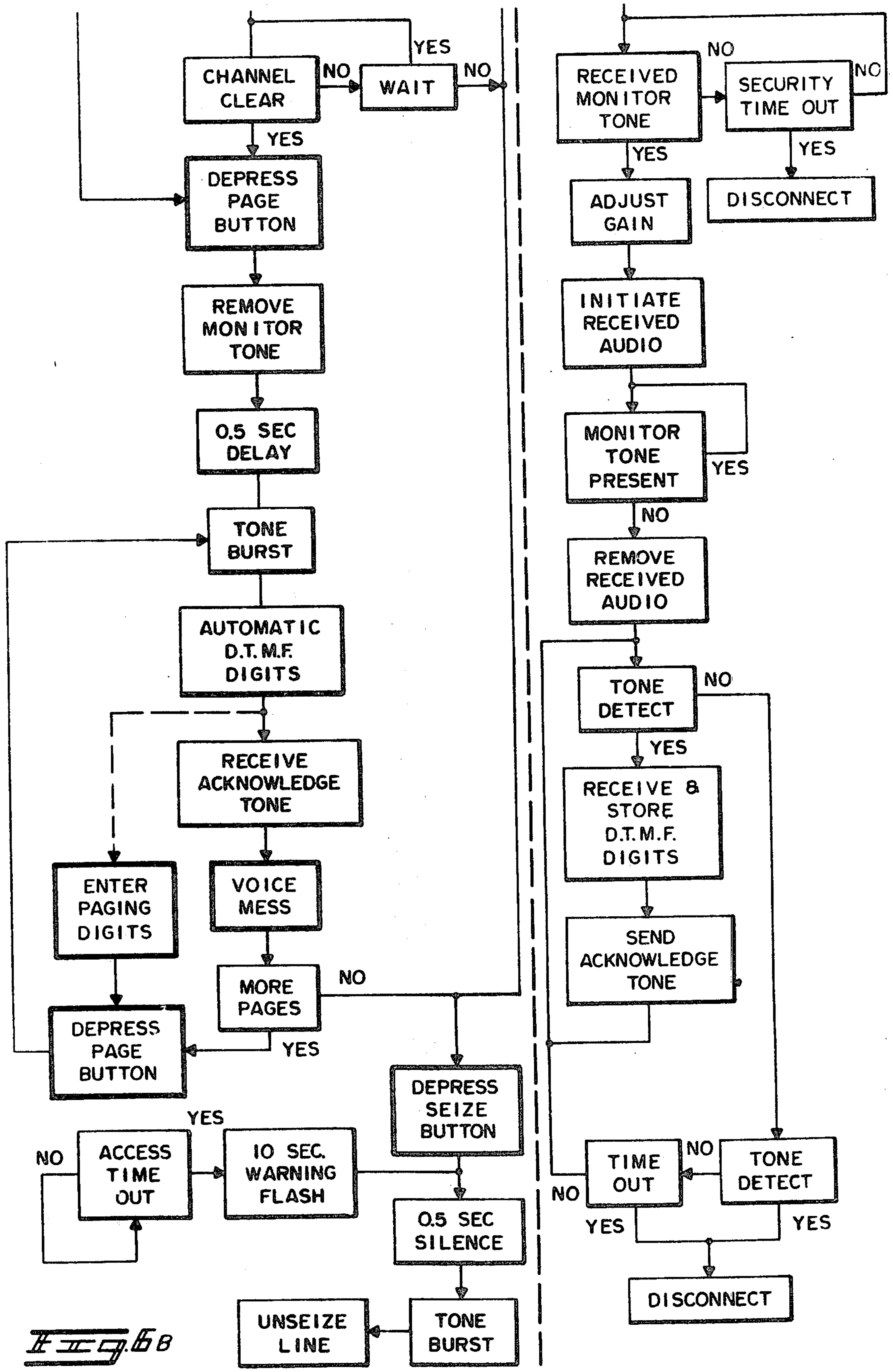

The operation of the encoder 10 of FIG. 2 will be best understood in the perspective of the system operation as shown in the flow chart of FIGS. 6A and 6B. The drawing shows the sequence of events as in the switched network connection. Those steps which are omitted for dedicated line operation will be discussed hereinbelow. In the drawing, the steps performed by the operator are emphasized by a bold outline for clarity. The left hand columns follow the sequence of steps which occur at the encoder and the right hand columns follow the corresponding sequence of steps which occur at the terminal.

To initiate a call, the operator depresses a "seize" button on the keyboard 20. This input instructs the interface 21 to connect the encoder 10 to a voice-pair of telephone lines. This button also starts an access timer for limiting the time on-line. The operator inserts a one or two digit code for the particular transmitter desired to be accessed. If a dial tone is received on the line, the operator then depresses a "dial" button and the automatic dialer will send out the dual tone, multi-frequency signals for the telephone number of the selected transmitter. If the desired terminal is busy, a busy signal will be heard at the encoder. If the terminal is not busy, it will connect the encoder to the transmitter and if the transmitter is not busy, the terminal will answer the line and after a three second delay will send back the "go-ahead" tone. When the "go-ahead" tone is received, the encoder will automatically adjust its gain to compensate for any line losses in the particular telephone path being used. The encoder will then send the monitor tone down the lines to the terminal and if the monitor tone is received within the window allowed, the terminal will correspondingly adjust its gain. If the monitor tone is not received within the window, the terminal will disconnect from the line. After the gain of the terminal has been adjusted, the terminal initiates "received audio", meaning that any signal, presently being transmitted by the transmitter 16 will be sent back on the telephone line to the encoder console, to be heard by the operator. If there is intelligent audio on the channel, the operator will wait until it is clear before paging. At some point during the interval after depressing the "dial" button, the operator will have entered at the keyboard 20 the digits for the page code of the desired address. When the channel is clear, the operator will depress "page", the encoder will stop the monitor tone, delay for 0.5 seconds, then send a tone burst to the terminal. The terminal meanwhile has been sending the "received audio" as long as the monitor tone was present. When the monitor tone ceases, the terminal stops sending "received audio" and when the tone burst from the encoder is received, circuits in the terminal are initialized for receiving the DTMF digits which follow automatically the tone burst from the encoder. When the complete page code has been received, the terminal will send an "acknowledge" tone to the encoder which will be indicated by one or more of the indicators 36. Following receipt of the acknowledge tone, the operator may send a voice message to the pager addressed if such is desired. In either case, the operator may follow by entering more page digits and depressing "page" again, repeating the sequence along as the access timer will allow, the access time being predetermined at the encoder. When no more pages are to be sent, the operator depresses "seize" again and following a 0.5 second silent period a tone burst is sent down the telephone line to the terminal and the line is freed at the encoder end. If the time allowed by the access timer runs out before the operator stops paging, a ten second warning flash on one of the indicators 36 will alert the operator to complete the current page and stop paging. If the operator should ignore the warning flash, the tone burst will automatically be sent and the line released. At the terminal end, if the tone burst preceding the transmission of the DTMF digits is not heard the terminal will listen for the tone burst indicating a disconnect. If the disconnect tone is not heard, the terminal will wait for a predetermined interval before looking again for the tone and at the end of the timer period, the terminal will disconnect automatically.

Thus, it will be seen that all unnecessary steps have been eliminated at the encoder and the operator has merely to provide the necessary information for the automatic sequences to proceed.

What is claimed is:

1. A digital gain control circuit comprising programmable gain amplifier means, binary counter means coupled to at least one gain control input of said amplifier means, control means including control circuits operatively coupled to the counter means, threshold detector means coupled to an output of the amplifier means and to an input of the control means, switchable-range gain control means coupled to said output of the gain amplifier means and to an output of the control means, tone detector means coupled to an output of the switchable-range gain control means and to an input of the control means.

2. A digital gain control circuit in accordance with claim 1 and wherein, the control means further includes resetting means which in the absence of a received signal, resets the binary counter means, sets the gain of the amplifier means at minimum, and sets the switchable-range gain control means for wide range.

3. A digital gain control circuit in accordance with claim 1 and wherein the programable gain amplifier means is coupled to receive signal from a pair of telephone lines.

4. A digital gain control circuit in accordance with claim 3 and wherein the tone detector means includes activating means which activates the counting sequence of the counter means when a predetermined tone is detected, the gain of the amplifier means being controlled in response to the count of the counter means.

5. A digital gain control circuit in accordance with claim 4 wherein the threshold detector means includes signalling means which provides an output signal in response to a predetermined level of output signal from the amplifier means and wherein the counting sequence of the counter means is controllable in response to the output signal of the threshold detector means whereby said predetermined level of output signal is maintained during the reception of a signal from the telephone lines.

6. A digital gain control circuit in accordance with claim 5 and wherein the switchable-range gain control means includes mode setting means which switches said gain control means to a narrow range mode when the counter means stops counting and maintains a count.

* * * * *

UNITED STATES PATENT AND TRADEMARK OFFICE

Certificate

Patent No. 4,168,399

Patented September 18, 1979

Thomas Victor D'Amico, Mark Henry Rackin, Victor Jensen, Norman Eugene Schultz, John Joseph Cady, William John Macko, Carl Raymond Steinbach and Nicholas Petrakos Application having been made by Thomas Victor D'Amico, Mark Henry Rackin, Victor Jensen, Norman Eugene Schultz, John Joseph Cady, William John Macko, Carl Raymond Steinbach and Nicholas Petrakos, the inventors named in the patent above identified, and Motorola, Inc., Schaumburg, Illinois, a corporation of Illinois, the assignee, for the issuance of a certificate under the provisions of Title 35, Section 256, of the United States Code, deleting the names of Victor Jensen, John J. Cady, William J. Macko, Nicholas Petrakos, Norman E. Schultz and Carl R. Steinbach as joint inventors, and a showing and proof of facts satisfying the requirements of the said section having been submitted, it is this 5th day of August 1980, certified that the names of the said Victor Jensen, John J. Cady, William J. Macko, Nicholas Petrakos, Norman E. Schultz and Carl R. Steinbach are hereby deleted from the said patent as joint inventors with the said Thomas Victor D'Amico and Mark Henry Rackin.

FRED W. SHERLING,
*Associate Solicitor.*